(12) United States Patent
Truong

(10) Patent No.: US 6,445,258 B1
(45) Date of Patent: Sep. 3, 2002

(54) OSCILLATOR CIRCUIT WITH SIGNAL BUFFERING AND START-UP CIRCUITRY

(75) Inventor: Tom C. Truong, San Jose, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 09/832,686

(22) Filed: Apr. 10, 2001

(51) Int. Cl.[7] .............................. H03B 5/06; H03B 5/36
(52) U.S. Cl. ................................. 331/158; 331/116 FE; 331/175; 331/186
(58) Field of Search .............................. 331/74, 116 R, 331/116 FE, 116 M, 117 R, 117 FE, 117 D, 158, 160, 175, 176, 182, 183, 185, 186

(56) References Cited

U.S. PATENT DOCUMENTS 5,457,433 A * 10/1995 Westwick ............. 331/116 FE

OTHER PUBLICATIONS

Vittoz et al, "High–Performance Crystal Oscillator Circuits: Theory and Application," IEEE Journal of Solid–Sate Circuits, vol. 23, No. 3, Jun. 1988, pp 774–783.

* cited by examiner

Primary Examiner—David Mis
(74) Attorney, Agent, or Firm—Townsend and Townsend and Crew LLP; Henry K. Woodward

(57) ABSTRACT

A crystal oscillator circuit includes a crystal driven by a variable current source having a transconductance device with transconductance dependent on current, and a CMOS buffer circuit for receiving a sinusoidal signal from the crystal and providing a square wave output signal. The buffer circuit includes first and second bi-level buffers capacitively coupled to receive sinusoidal signals and operating in a push-pull mode for providing square wave output signals from each of said first and second buffers, and a third buffer driven by output signals from the first and second buffers, whereby duty cycle of the first and second buffers is controlled by bias voltages applied to CMOS transistors in the buffers. The circuit further includes a bias current circuit which provides through the variable current source a bias current, I-bias, which is set to provide an optimum transconductance for oscillation start-up and a reduced regulated bias current once oscillation voltage increases, thereby preventing runaway oscillations.

16 Claims, 4 Drawing Sheets

OSCILLATOR CIRCUIT WITH SIGNAL BUFFERING AND START-UP CIRCUITRY

BACKGROUND OF THE INVENTION

This invention relates generally to crystal oscillator circuits, and more particularly the invention relates to a crystal oscillator circuit having sinusoidal to square wave buffering with reduced power consumption and controlled oscillation start-up and steady state operation.

FIG. 1 illustrates an oscillator circuit in an RF signal transmitter and receiver circuit. The crystal 10 is driven by a current source 12 with the current source receiving the oscillator output in a feedback loop 14 and controlled by a bias current 16 applied to current source 12. The output of crystal 10 (e.g., 12 MHz) is applied through phase lockloop 18 to a local oscillator 20 having a higher frequency output (e.g., 2.4 GHz). A loop filter 22 provides feedback from local oscillator 22 to PLL18. The output of local oscillator 20 is applied to mixers 24,26 which respectively step down the frequency of received radio signal or step up the frequency of a transmission radio signal through amplifiers 28,30 and switch/filter 32 to antenna 34.

Operation of the crystal circuit depends on a transconductance device in the oscillator circuit. FIG. 2 is a schematic of a basic 3 point oscillator in which current source 42 passes current through a transconductance device or transistor 40 with the transconductance depending on current magnitude, which in turn controls operation of crystal 10. A paper which describes the theory of operation of the 3 point oscillator is Vittoz et al., "High Performance Crystal Oscillator Circuits: Theory and Application", IEEE Journal of Solid State Circuits, Volume 23, No. 3, June 1988 (pp. 774–783). As there described, crystal oscillation depends on the transconductance of transistor 40 as illustrated by the complex plane representation of the 3 point oscillator shown in FIG. 3. As described, Z(c) is impedance looking into the circuit from the crystal. From this impedance circle, the conditions for start-up is to have transconductance (gm) set between the gm critical value and the gm max value and preferably at gin optimum. In an ideal environment, there are two modes of operation. For start-up, gm is set to the optimum value on the Z(c) circle. This will result in a maximum negative resistance seen by the crystal for oscillation amplitude buildup. Once amplitude increases to a pre-determined level, transconductance must be reduced in order to maintain the amplitude. Thus in preferred operation, the transconductance of the oscillator must be varied from start-up to steady safe conditions.

Referring again to FIG. 1, PLL 18 requires a low jitter square wave reference signal from the crystal 10. This necessitates a buffer for wave shaping. Further, the crystal oscillator circuit requires control of drive current so that the oscillator start-up can be accelerated but with drive current reduced once a desired amplitude level is obtained.

BRIEF SUMMARY OF THE INVENTION

In accordance with the invention a buffer circuit is provided for use in an oscillator circuit in driving a phase locked loop. The oscillator receives a sinusoidal wave and provides a square wave with reduced jitter and power consumption.

More particularly, two buffers are driven in push-pull fashion and drive a third buffer. The first two buffers have duty cycles set such that there is no overlap of the buffer outputs. In a preferred embodiment, CMOS circuitry is employed in the buffer circuits for reduced power consumption. A complimentary transistor pair functions as an image resistor to isolate noise in a bias voltage branch from the buffer gain stage.

Circuitry is provided to optimize oscillator start-up time with minimal variation across processing, temperature, and supply voltage variations. The circuitry responds to a start-up bias current for setting transconductance in the oscillator circuit at an optimum value with the circuitry having feedback to control transconductance as the oscillation voltage increases, thus preventing a runaway oscillation condition.

The invention and objects and features thereof will be more readily apparent from the following detailed description and dependent claims when taken with the drawings.

DETAILED DESCRIPTION OF ILLUSTRATED EMBODIMENTS

Figure 4:
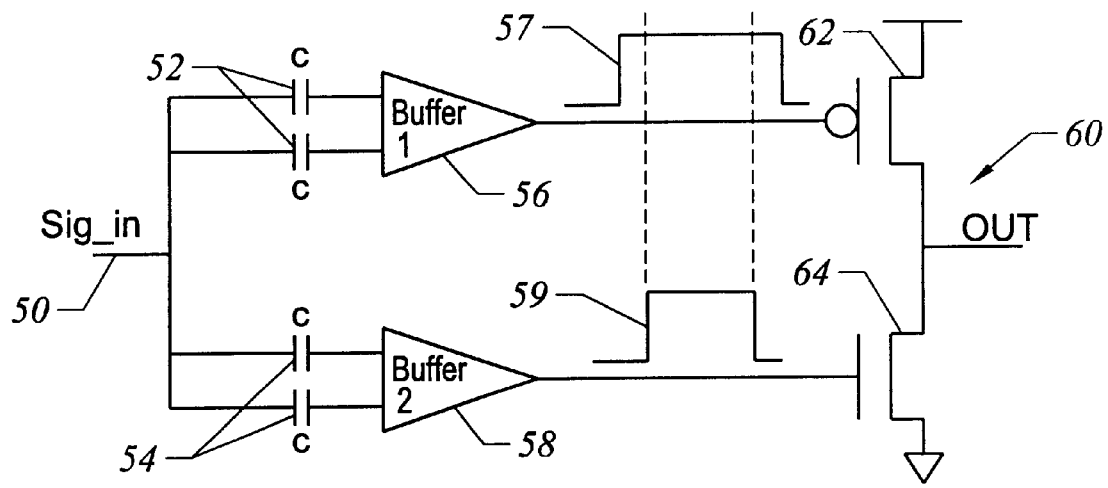
FIG. 4 is a block diagram of a sinusoidal to square wave buffer in accordance with the invention.

FIG. 4 is a block diagram of a sinusoidal to square wave buffer in accordance with one embodiment of the invention. The sinusoidal signal from the crystal oscillator is applied at 50 and coupled through capacitors 52 and 54 through a first buffer 56 and a second buffer 58, respectively. Buffers 56,58 drive a CMOS transistor pair of an output buffer 60 with the output 57 from buffer 56 applied to P Channel transistor 62, and the output 59 from buffer 58 controlling N channel transistor 54. In accordance with a feature of the invention, the duty cycle of buffer 56 and the duty cycle of buffer 58 are controlled whereby conduction of P-Channel transistor 62 does not overlap with conduction of N-Channel transistor 64. More particularly, bias circuitry is provided within buffer 56 and within buffer 58 that establishes the duty cycle of the output of each buffer whereby the positive interval of output 57 during which transistor 62 is off is greater than the positive interval of output 59 during which transistor 64 is on. Accordingly, the conduction of transistors 62,64 are mutually exclusive.

Figure 5:
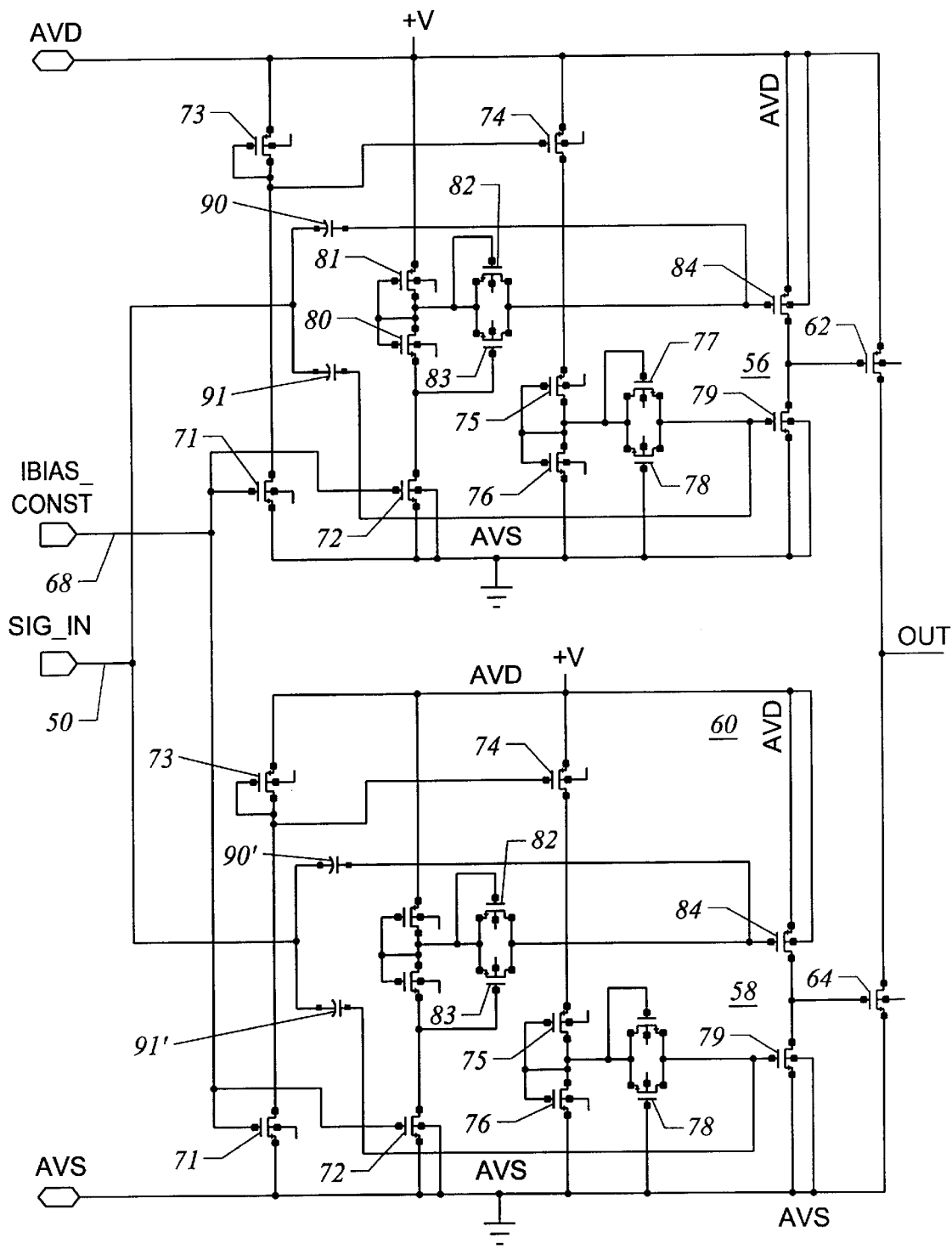
FIG. 5 is a schematic of one embodiment of the buffer of FIG. 4.

FIG. 5 is a schematic of one embodiment of the buffer circuitry of FIG. 4 and further illustrates bias circuitry for establishing the duty cycle of buffers 56,58. The crystal oscillator output is again applied at 50, and a pre-determined bias current, I-bias which is pre-determined to establish an optimum transconductance for an oscillator start-up, is applied at 68. Input to 68 is applied to the base of transistors 71,72,71', and 72'. Transistor 71 and transistor 73 are serially connected between +V and ground with transistor 73 functioning as a current mirror for transistor 74. Transistor 74 functions with transistors 75 and 76 in establishing a bias voltage at the common terminal transistors 75,76 which is applied through a high impedance isolation resistance defined by parallel transistors 77, 78 to the base of N channel transistor 79 of buffer 56. Similarly, transistor 72 is serially connected with transistors 80 and 81 between plus V and ground with the common terminal of transistors 80, 81 establishing a bias voltage which is applied through high resistance transistors 82,83 to the gate of P-Channel transistor 84. Transistors 79,84 are a serial transistor pair output for buffer 56 with the output taken at the common terminal of the transistors and applied to the gate of transistor 62.

Similar circuitry is shown in buffer 58 with corresponding transistor elements identified by the same reference numeral 5. The input on line 50 is capacitively coupled through capacitors 90, 91 and 90', 91' to the gates of transistors 79, 84.

Figure 6:
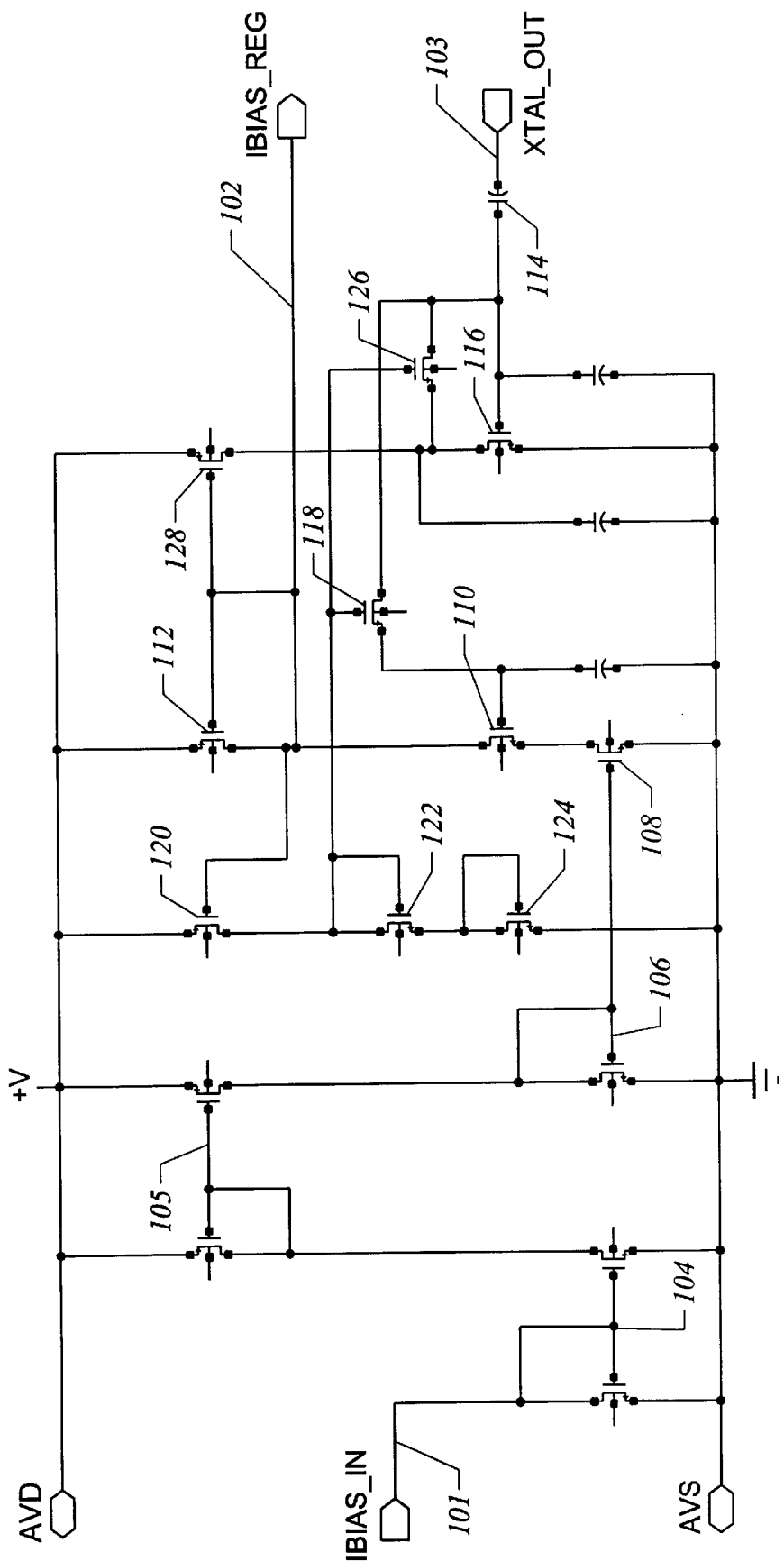
FIG. 6 is a schematic of a bias current regulator for use in a crystal oscillator in accordance with one embodiment of the invention.

As noted above, the optimum transconductance for starting oscillation of the circuit is established by a current, I-bias, which is a constant. As further described, after oscillation begins and the amplitude of the oscillator signal increases, a regulated I-bias current is required to prevent runaway oscillation of the circuit. FIG. 6 is a schematic of a bias current regulator for use with the crystal oscillator in accordance with another embodiment of the invention. The pre-determined I-bias current is applied at terminal 101 with regulated I-bias current taken at line 102 with current on line 102 regulated in accordance with the crystal output voltage which is applied on line 103. In this circuit the I-bias input on line 101 is passed through two current branches comprising current mirrors 104, 105, and 106 whereby a current proportional to I-bias is applied to the gate of transistor 108. Current source transistor 108 is similarly connected through resistive transistors 110 and 112 between +V and ground with a common terminal of transistors 110,112 providing the regulated output on line 102. Line 103 provides a feedback from the crystal output with the output coupled through capacitor 114 to the base of transistor 116 and through transistor 118 to the gate of 110. Transistor 120 is serially connected with diode connected transistors 122 and 124 to establish the gate voltage of transistor 118 and of transistor 126. Transistors 116 and 128 establish the voltage across transistor 126 and on the drain of transistor 118 in response to the initial I-bias current.

Figure 1:
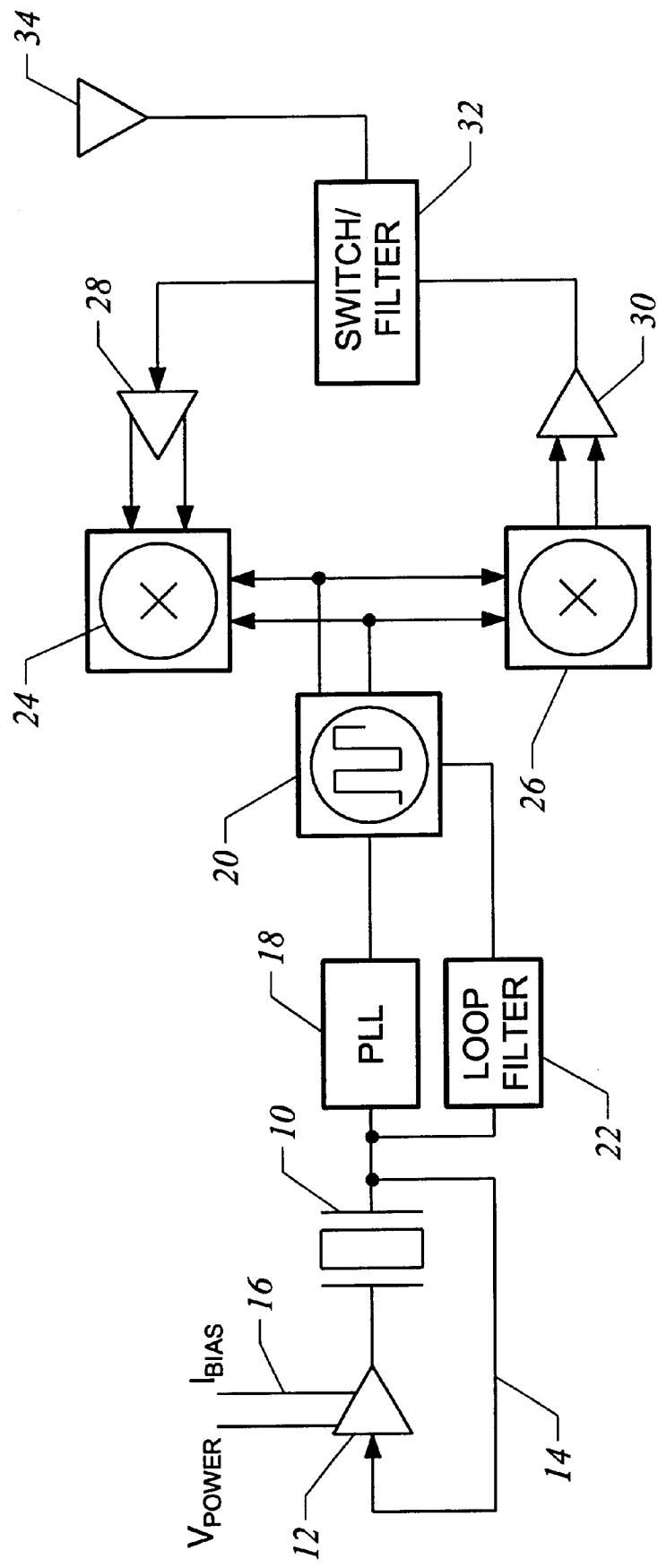
FIG. 1 is a block diagram of a crystal oscillator circuit in a radio transmitter/receiver circuit.
Figure 2:
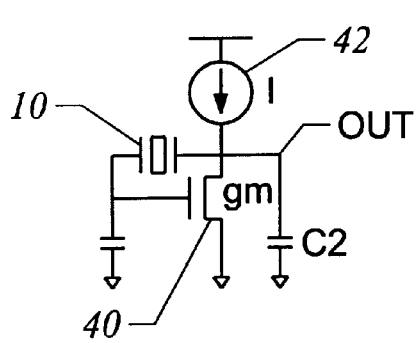
FIG. 2 illustrates a 3 point oscillator circuit with a current source for setting transconductance of the oscillator transistor.
Figure 3:
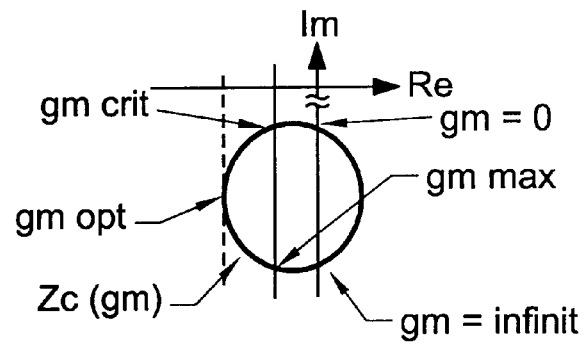
FIG. 3 illustrates the complex plane representative of the 3 point oscillator and the importance of transconductance for initial start of the oscillator transistor.

When the crystal output voltage on line 103 begins to rise, the increasing voltage is coupled through capacitor 114 and transistor 118 to increase the voltage bias on transistor 110. However, transistor 110 is operated in a depletion mode and the increasing gate bias increases the resistance of transistor 110 thereby reducing the current through transistors 108, 110,112 and on the output line 102. Accordingly, the regulated I-bias current decreases as the crystal output on line 103 increases and adjusts the transconductance from an optimum value towards the critical value as illustrated in FIG. 3.

The buffer circuit illustrated in FIGS. 4 and 5 are able to convert a small sinusoid signal into a square wave with high edge rate and low jitter which is suitable as a reference frequency for a 2.4 GHz phase lock loop. Current consumption in the buffer is minimized by shaping the input signal wave form from sinusoid to two square wave signals with the duty cycles of the two square wave signals set to eliminate crowbar current of the output buffer due to simultaneous conduction of complimentary CMOS transistors. The duty cycles of the buffers are established by current sources connected through voltage dividers with the current sources being responsive to the I-bias current. A complimentary NMOS/PMOS transistor pair is utilized to couple the bias voltages to the buffer transistors with the impedance of the transistor pair reducing jitter noise present in the bias circuitry from reaching the gates of the output buffer transistor pair. Transconductance is optimally set for start up of the crystal oscillator across process, temperature, and supply voltage variations with the transconductance being adjusted in response to crystal output voltage to prevent overdrive of the oscillator circuit.

While the invention has been described with reference to specific embodiments, the description is illustrative for the invention and is not to be construed as limiting the invention. Various modifications and applications may occur to those skilled in the arts without departing from the true spirit and scope of the invention as defined by the appended claims.

What is claimed is:

1. A crystal oscillator circuit comprising
  a crystal circuit driven by a variable current source and having a transconductance which is dependent on current, and
  a CMOS transistor buffer circuit for receiving a sinusoidal signal from the crystal circuit and providing a square wave output signal, the buffer circuit including first and second bi-level buffers capacitively coupled to receive a sinusoidal signal and operating in a push-pull mode for providing square wave output signals from each of said first and second buffers, and a third buffer driven by output signals from the first and second buffers, whereby duty cycles of the first and second buffers are controlled by bias voltages applied to CMOS transistors in the buffers.

2. The crystal oscillator circuit is defined by claim 1 wherein the bias voltages are generated by bias circuitry which establishes the bias voltages by applying a current through a voltage divider.

3. The crystal oscillator circuit is defined by claim 2 wherein the voltage divider comprises a CMOS transistor pair.

4. The crystal oscillator circuit is defined by claim 3 wherein the bias circuitry further includes image resistors coupling the voltage dividers to the CMOS transistors.

5. The crystal oscillator circuit is defined by claim 4 wherein the image resistors comprise parallel CMOS transistor pairs.

6. The crystal oscillator circuit as defined by claim 1 and including a bias current circuit which provides to the variable current source a bias current, I-bias, which is set to provide an optimal transconductance for oscillation start-up and a reduced regulated bias current valued once oscillation voltage increases, thereby preventing runaway oscillation.

7. The crystal oscillator circuit as defined by claim 6 wherein the bias current circuit includes a current mirror serially connected with a voltage divider for applying a start-up bias current to the variable current source, the voltage divider reducing the regulated bias current as oscillation amplitude increases.

8. The crystal oscillator circuit is defined by claim 7 wherein the bias current circuit includes feedback from the oscillator which is coupled to a resistor in the voltage divider and increases resistance of the resistor as oscillation amplitude increases.

9. A CMOS transistor buffer circuit for receiving a sinusoidal signal from a crystal and providing a square wave output, the buffer circuit comprising
  first and second bi-level buffers capacitively coupled to receive a sinusoidal signal and operating in a push-pull mode for providing square wave output signals from each of said first and second buffers, and
  a third buffer driven by the output signals from the first and second buffers, whereby duty cycle of the first and second buffers is controlled by bias voltages applied to CMOS transistors in the buffers.

10. The buffer circuit as defined by claim 9 wherein the bias circuitry establishes bias voltages by applying a current through a voltage divider.

11. The buffer circuit as defined by claim 10 wherein the voltage divider comprises a CMOS transistor pair.

12. The buffer circuit as defined by claim 11 wherein the bias circuitry further includes image resistors coupling the voltage dividers to the CMOS transistors.

13. The buffer circuit as defined by claim 12 wherein the image resistors comprise parallel CMOS transistor pairs.

14. In a crystal oscillator circuit, a crystal driven by a variable current source having a transconductance device with transconductance dependent on current, and including a bias current circuit which provides to the variable current source a bias current, I-bias, which is set to provide an optimum transconductance for oscillation start-up and a reduced regulated bias current value once oscillation voltage increases, thereby preventing runaway oscillations.

15. The crystal oscillator circuit as defined by claim 14 wherein the bias current circuit includes a current mirror serially connected with a voltage divider for applying for a start-up bias current to the variable current source, the voltage divider reducing the regulated bias current as oscillation amplitude increases.

16. The crystal oscillator circuit as defined by claim 15 wherein the bias current circuit includes feedback from the oscillator which is coupled to a resistor in the voltage divider and increases resistance of the resistor as oscillation amplitude increases.

* * * * *